(12) United States Patent
Hooper et al.

(10) Patent No.: US 8,894,868 B2
(45) Date of Patent: Nov. 25, 2014

(54) SUBSTRATE CONTAINING APERTURE AND METHODS OF FORMING THE SAME

(75) Inventors: Andy Hooper, Portland, OR (US); Daragh Finn, Portland, OR (US); Tim Webb, Portland, OR (US); Lynn Sheehan, Vancouver, WA (US); Kenneth Pettigrew, Portland, OR (US); Yu Chong Tai, Pasadena, CA (US)

(73) Assignee: Electro Scientific Industries, Inc., Portland, OR (US)

( * ) Notice: Subject to any disclaimer, the term of this patent is extended or adjusted under 35 U.S.C. 154(b) by 412 days.

(21) Appl. No.: 13/267,813

(22) Filed: Oct. 6, 2011

(65) Prior Publication Data

US 2013/0089701 A1  Apr. 11, 2013

(51) Int. Cl.
| | |
|---|---|
| *H01L 21/302* | (2006.01) |
| *B23K 26/00* | (2014.01) |
| *B44C 1/22* | (2006.01) |
| *H01L 21/306* | (2006.01) |
| *H01L 21/3065* | (2006.01) |
| *B23K 26/36* | (2014.01) |
| *B23K 26/38* | (2014.01) |
| *B23K 26/40* | (2014.01) |
| *H01L 21/768* | (2006.01) |

(52) U.S. Cl.
CPC . *B23K 26/00* (2013.01); *B44C 1/22* (2013.01); *H01L 21/30604* (2013.01); *H01L 21/3065* (2013.01); *B23K 26/367* (2013.01); *B23K 26/381* (2013.01); *B23K 26/385* (2013.01); *B23K 26/4075* (2013.01); *B23K 26/407* (2013.01); *B23K 26/408* (2013.01); *B23K 26/4095* (2013.01); *H01L 21/76898* (2013.01); *Y10S 438/94* (2013.01)
USPC .......... 216/17; 216/41; 216/53; 216/56; 216/57; 216/58; 216/62; 216/65; 216/79; 216/80; 216/97; 216/99; 438/700; 438/704; 438/706; 438/753; 438/940

(58) Field of Classification Search
None
See application file for complete search history.

(56) References Cited

U.S. PATENT DOCUMENTS

| | | |
|---|---|---|
| 5,425,816 A | 6/1995 | Cavicchi et al. |
| 6,379,573 B1 | 4/2002 | Kim et al. |
| 6,429,096 B1 | 8/2002 | Yanagida |

(Continued)

FOREIGN PATENT DOCUMENTS

| | | |
|---|---|---|
| JP | 8250634 A | 9/1996 |
| KR | 2010051754 A | 5/2010 |
| WO | WO2010/094998 A1 | 8/2010 |

OTHER PUBLICATIONS

JP 08-250634 A, Shimada, Keiji, Sep. 27, 1996, English language machine translation.*
Harry Robbins, et al. "Chemical Etching of Silicon", J. Electrochem. Soc.: Solid State Science and Technology, vol. 106, No. 6, Jun. 1959, pp. 505-508.
Harry Robbins, et al. "Chemical Etching of Silicon", J. Electrochem. Soc.: Solid State Science and Technology, vol. 107, No. 2, Feb. 1960, pp. 108-111.
B. Schwarts, et al. "Chemical Etching of Silicon", J. Electrochem. Soc.: Solid State Science and Technology, vol. 108, No. 4, Apr. 1961, pp. 365-372.
B. Schwarts, et al. "Chemical Etching of Silicon", J. Electrochem. Soc.: Solid State Science and Technology, vol. 123, No. 12, Dec. 1976, pp. 1903-1909.
Wet-Chemical Etching of Silicon, Jan. 17, 2011, www.microchemicals.eu/technical_information, 4 pages.
Keyence "VK-9700 Generation II", 28 pages.
Keyence "Shape Measurement Guide", 13 pages.
Keyence "VK-X100/X200 Series", 28 pages.
International Search Report of PCT/US2012/052532, 2 pages.
Written Opinion of PCT/US2012/052532, 6 pages.

*Primary Examiner* — Anita Alanko

(57) ABSTRACT

A method of forming an aperture (e.g., a through via, a blind via, a trench, an alignment feature, etc.) within a substrate includes irradiating a substrate with a laser beam to form a laser-machined feature having a sidewall. The laser-machined feature is then processed to change at least one characteristic (e.g., the sidewall surface roughness, diameter, taper, aspect ratio, cross-sectional profile, etc.) of the laser-machined feature. The laser-machined feature can be processed to form the aperture by performing an isotropic wet-etch process employing an etchant solution containing $HNO_3$, HF and, optionally acetic acid.

33 Claims, 6 Drawing Sheets

(56) References Cited

U.S. PATENT DOCUMENTS

| | | |
|---|---|---|
| 6,864,190 B2 | 3/2005 | Han et al. |
| 7,084,073 B2 | 8/2006 | Lee et al. |
| 7,316,067 B2 | 1/2008 | Blakey |
| 7,354,863 B2 | 4/2008 | Kirby et al. |
| 7,598,167 B2 | 10/2009 | Watkins et al. |
| 7,803,714 B2 | 9/2010 | Ramiah et al. |
| 7,906,437 B2 | 3/2011 | Keenan et al. |
| 2007/0281488 A1* | 12/2007 | Wells et al. .................. 438/705 |
| 2008/0076256 A1 | 3/2008 | Kawai et al. |
| 2008/0284041 A1 | 11/2008 | Jang et al. |
| 2009/0139570 A1 | 6/2009 | Kinoshita |
| 2010/0129984 A1* | 5/2010 | Vakanas et al. .............. 438/463 |
| 2010/0317146 A1 | 12/2010 | Sinha et al. |
| 2011/0131807 A1 | 6/2011 | Nashner et al. |
| 2011/0207323 A1 | 8/2011 | Ditizio |
| 2011/0229687 A1* | 9/2011 | Gu et al. ...................... 428/131 |
| 2012/0264296 A1* | 10/2012 | Chern et al. .................. 438/667 |

* cited by examiner

SUBSTRATE CONTAINING APERTURE AND METHODS OF FORMING THE SAME

BACKGROUND

Embodiments of the present invention exemplarily described herein relate generally to apertures formed in substrates and methods of forming the same. More particularly, embodiments of the present invention relate to methods of processing laser-machined features.

It is generally known that many semiconductor manufacturing applications require the use of "through-silicon vias." Typically, a through-silicon via or (TSV) is a vertical channel extending through a silicon substrate, which can be coated or filled with a conductive material to allow electrical current or heat to flow from one side of the substrate to the other. TSVs can be formed by various methods. For example, TSVs can be formed in a dry etch process in which reactive gases etch the substrate under vacuum. However dry etch processes can produce TSVs with sidewalls having an undesirably scalloped surface profile. To avoid the scalloped surface profile, the dry etch process is typically slowed significantly or the TSV is subjected to additional processing (e.g., coating and etching processes). TSVs can also be formed using lasers in which a laser beam heats and ablates the substrate. However, laser drilling typically produces TSVs having sidewalls with non-uniform composition and crystalline structure, and an undesirably rough surface profile. A number of processes, which include dry etching processes and wet etching processes, have been proposed to address the deleterious effects caused by laser drilling. Such processes have limited benefit, however, because they do not produce TSVs with many desirable characteristics (e.g., adequately smooth sidewalls and controllable aspect ratio, taper, entrance diameter, exit diameter and cross-sectional profile).

SUMMARY

In one embodiment, a method of forming an aperture within a substrate includes providing a substrate, irradiating the substrate with a laser beam to form a laser-machined feature within the substrate, wherein the laser-machined feature includes a sidewall. The sidewall can then be etched with at least one etchant solution to change at least one characteristic of the laser-machined feature. In one embodiment, the at least one etchant solution can include $HNO_3$ and HF.

In another embodiment, a method of forming an aperture within a substrate includes providing a substrate, irradiating the substrate with a laser beam to form a laser-machined feature within the substrate and etching a sidewall of the laser-machined feature to change at least one characteristic of the laser-machined feature. In one embodiment the etching can include etching the sidewall with a first etchant solution containing a first reactant at a first concentration and, after etching the sidewall with the first etchant solution, etching the sidewall with a second etchant solution containing the first reactant at a second concentration less than the first concentration.

In yet another embodiment, an improved method for forming an aperture in a substrate, which includes providing the substrate, irradiating the substrate with a laser beam to form a laser-machined feature within the substrate and having a cross-sectional profile, is disclosed in which the improvement includes changing the cross-sectional profile of the laser-machined feature. In one embodiment, the cross-sectional profile of the laser-machined feature can be changed by process that includes immersing the heat-affected zone in an etchant solution and, with the substrate immersed in the etchant solution, oxidizing a portion of the heat-affected zone and removing a portion of the oxidized heat-affected zone, thereby forming the aperture.

In still another embodiment, an article of manufacture can be characterized as including a substrate having a first surface, a second surface opposite the first surface, and an aperture extending from the first surface into the substrate toward the second surface, wherein a sidewall of the aperture has an average surface roughness, Ra, of less than 10 μm.

In yet another embodiment, an apparatus for forming an aperture in a substrate can be characterized as including a laser and a wet-etch processing system. The laser is configured to irradiate the substrate with a laser beam to form a laser-machined feature within the substrate and a heat-affected zone within the substrate adjacent to the laser-machined feature. The wet-etch processing system is configured to supply an etchant solution comprising $HNO_3$ and HF to the substrate to remove at least a portion of the heat-affected zone.

DETAILED DESCRIPTION OF THE ILLUSTRATED EMBODIMENTS

Figure 1:
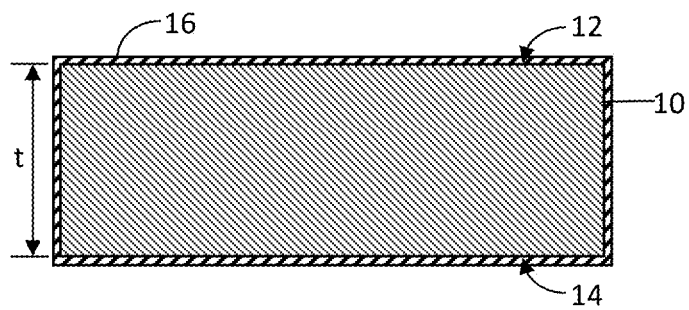
FIGS. 1 to 3 are sectional views schematically illustrating one embodiment of a process of forming an aperture in a substrate.

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates. In the drawings, the thickness of layers and general shapes of structures have been exaggerated for clarity. Like numbers refer to like elements throughout.

Figure 2:
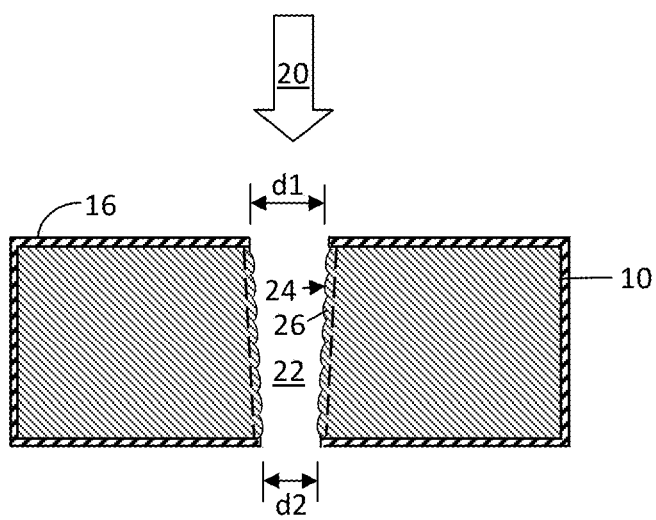
Figure 3:
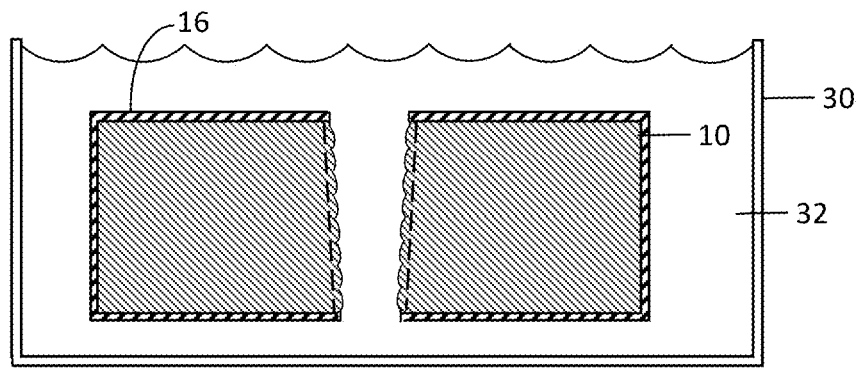

FIGS. 1 to 3 are sectional views schematically illustrating one embodiment of a method of forming an aperture in a substrate.

Referring to FIG. 1, a substrate 10 having an upper surface (also referred to as a "first surface") 12 and a lower surface (also referred to as a "second surface") 14 may be provided. The substrate 10 can be formed of a material such as silicon. In one embodiment, the substrate 10 is provided as a doped or undoped silicon substrate (e.g., a monocrystalline silicon substrate, a polycrystalline silicon substrate, or the like). In one embodiment, the substrate 10 is provided as an interposer substrate. As is known in the art, interposer substrates enable communication (e.g., electrical, optical, or the like, or a combination thereof) between two devices or chips (e.g., in an electronic package). In other embodiments, however, the substrate 10 may be provided as a wafer, a semiconductor die, a workpiece, or the like. In still other embodiments, the substrate 10 can be formed of one or more materials such as glass, sapphire, SiC, GaN, GaAs, InP, and the like. A thickness, t, of the substrate 10 between the first surface 12 and the second surface 14 may be in a range from about 15 to about 1500 µm. In the illustrated embodiment, the first and second surfaces 12 and 14 are bare (i.e., components such as devices, conductive lines, and the like, are absent from each surface). In other embodiments, one or more components (e.g., devices, conductive lines, and the like) may be formed on the first surface 12, the second surface 14 or a combination thereof.

An etchmask layer 16 is formed on the first surface 12, on the second surface 14 and on side surfaces extending between the first and second surfaces 12 and 14. The etchmask layer 16 is formed to allow the substrate 10 to be etched at selected locations during a subsequent etch process, which will be discussed in greater detail below. In one embodiment, the etchmask layer 16 is formed from a material that can be etched at a slower rate during the subsequent etch process than the substrate 10, or that will not be etched at all. For example, the etchmask layer 16 may be formed of a nitride material (e.g., silicon nitride, boron nitride, silicon oxynitride, etc.), an oxide material (e.g., silicon oxide, etc.), a region of the substrate 10 containing dopant material (e.g., P, As, Sb, B, Ga, In, Al, etc.), a polymer material (e.g., photoresist, polyvinyl alcohol, lacquer, varnish, wax, glue, ink, dye, pigment, tape, poly(methyl methacrylate), polystyrene, surfactants, etc.), or the like or any combination thereof, by any suitable process.

Referring to FIG. 2, the substrate 10 is irradiated with a laser beam 20 during a laser-drilling process (e.g., a trepan laser-drilling process, a percussion laser-drilling process, or the like or a combination thereof) to form a laser-machined feature 22. As exemplarily illustrated, the laser-machined feature 22 is a through via. It will be appreciated, however, that the laser-machined feature 22 could also be provided as a blind via, trench, an alignment feature, or the like or a combination thereof. In one embodiment, the laser-drilling process is performed such that the portion of etchmask layer 16 on the first surface 12 of substrate 10, the substrate 10 and the portion of etchmask layer 16 on the second surface 14 of substrate 10 are sequentially irradiated with the laser beam 20 to form the laser-machined feature 22.

Generally, characteristics of the laser-machined feature 22 such as aspect ratio, entrance diameter (i.e., diameter d1), exit diameter (i.e., diameter d2), taper (i.e., ratio of the exit diameter to the entrance diameter), aspect ratio (i.e., ratio of the feature length to the feature width) and cross-sectional profile can be influenced by adjusting one or more parameters of the laser-drilling process. Examples of parameters of the laser-drilling process that can be adjusted include, for example, focal plane location, laser pulse energy, laser pulse duration, laser pulse temporal profile, laser pulse repetition rate, number of laser pulses, laser spot size, wavelength, and the like. The entrance diameter d1 and the exit diameter d2 can be in a range from about 1 µm to about 500 µm. In the illustrated embodiment, the exit diameter d2 is less than the entrance diameter d1. In another embodiment, however, the exit diameter d2 can be equal to the entrance diameter d1. Accordingly, the cross-sectional profile of the laser-machined feature 22 can be tapered (as illustrated) or vertical. Generally, the aspect ratio of the laser-machined feature 22 is in a range between about 1:1 to about 50:1. For example, the aspect ratio of the laser-machined feature 22 can be in a range between 2:1 to 50:1. In one embodiment, the aspect ratio of the laser-machined feature 22 is about 20:1.

During the laser-drilling process, material (e.g., of the substrate 10 and the etchmask layer 16) irradiated by the laser beam 20 is ejected from its original location in gaseous, liquid and possibly solid form. As the laser-drilling process progresses through the substrate 10, the ejected material can cool and stick to surfaces that have been previously formed by the laser-drilling process. As a result, sidewalls 24 of the laser-machined feature 22 can be undesirably rough. For example, the sidewalls 24 of the laser-machined feature 22 can have a surface roughness, Ra, of greater than 10 µm. Also during the laser-drilling process, portions of the substrate 10 adjacent to regions irradiated by the laser beam 20 can become heated, creating "heat affected zone" or (HAZ) 26 formed of reflowed substrate material, amorphous substrate material, polycrystalline substrate material, recrystallized substrate material, and the like. The HAZ 26 of substrate 10 may also include high-stress regions, cracks, and other thermally-induced features. Accordingly, the HAZ 26 may extend from the sidewalls 24 of the laser-machined feature 22 some distance into the substrate 10. When the substrate 10 is formed of silicon material, the HAZ 26 may be formed of silicate material, melted silicon, reflowed silicon, recast silicon, recrystallized silicon, polycrystalline silicon, amorphous silicon, or the like or a combination thereof.

After forming the laser-machined feature 22, the sidewalls 24 can be etched during an etching process such that the HAZ 26 is at least partially removed to form an aperture. In another embodiment, however, the HAZ 26 can be completely removed during the etching process. Generally, the nature of the aperture will correspond to that of the laser-machined via 22. For example, if the laser-machined feature 22 is a through via, then the aperture will also be a through via. Likewise, if the laser-machined feature 22 is a blind via, a trench, an alignment feature, etc., then the aperture will also be a blind via, a trench, an alignment feature, etc. In another embodiment, however, the nature of the aperture will not correspond to that of the laser-machined via 22. For example, if the laser-machined feature 22 is a blind via, then the aperture can be a through via. As will be discussed in greater detail below, one or more characteristics of the laser-machined feature 22 (e.g., the surface roughness of sidewalls 24, the entrance diameter d1, the exit diameter d2, the taper, the aspect ratio, the cross-sectional profile, etc.) can be changed during the etching process to produce the aperture.

The etching process includes one or more wet-etch processes in which an etchant solution is used to etch sidewalls 24 of the laser-machined feature 22. For example, referring to FIG. 3, a wet-etch process can be performed by immersing the substrate 10 in an etchant bath 30 containing the etchant solution (identified at 32). The etch rate and effects of the wet-etch process on the laser-machined feature 22, and thus the characteristics of the aperture produced, can be influenced by adjusting one or more parameters of the one or more wet-etch processes employed in the etching process. Parameters of a wet-etch process (also referred to herein as "wet-etch parameters") that can be adjusted include, for example, the composition of the etchant solution 32, the total volume of the etchant solution 32 used to etch an area or volume of the substrate 10, the temperature of the etchant solution 32, duration of the wet-etch process, degree of agitation (or lack thereof) of etchant solution 32 in the etchant bath 30, and the like.

The etchant solution 32 can include an etchant solution that will isotropically etch the substrate 10. When the substrate 10 is formed of silicon material, the etchant solution 32 can, for example, include a mixture of reactants. For example, the etchant solution 32 can include a mixture of a first reactant capable of oxidizing a portion of the substrate 10 (e.g., nitric acid, $HNO_3$) and a second reactant capable of removing the oxidized portion of the substrate 10 (e.g., hydrofluoric acid, HF). Optionally, the etchant solution 32 can include acetic acid ($CH_3COOH$) in addition to mixture of $HNO_3$ and HF. In another embodiment, the etchant solution 32 may also include at least one additive such as water, an alcohol (e.g., ethanol, methanol, isopropyl alcohol, etc.), an organic solvent (e.g., acetone, etc.), or the like or a combination thereof. Alcohols and organic solvents can be added to ensure that the surface tension of the etchant solution 32 is adequate to allow the etchant solution to flow into the laser-machined feature 22.

In one embodiment, the etchant solution 32 can be treated before the substrate 10 is immersed within the etchant bath 30 to reduce an etch initiation period of the etchant solution 32. As used herein, the term "etch initiation period" refers to the amount of time it takes for the etchant solution 32 to begin etching the substrate 10 after the substrate 10 has been immersed within the etchant bath 30. Thus in one embodiment, after the substrate 10 is immersed within the etchant bath 30, etchant solution 32 that has been treated will begin etching the substrate 10 faster than etchant solution 32 that has not been adequately treated. In one embodiment, the etchant solution 32 is treated by adding an agent such as sodium nitrite ($NaNO_2$) to the etchant solution 32. It will be appreciated that the amount of agent to be added will vary depending upon, for example, volume of the etchant solution 32 in the etchant bath 30, or the like. In another embodiment, the etchant solution 32 is treated by immersing a seed material within the etchant bath 30. In one embodiment, the seed material is formed of the same material as the substrate 10. In another embodiment, at least one surface of the seed material is roughened to enhance an etch rate of the seed material by the etchant solution 32. In one embodiment, the seed material is a silicon piece (e.g., measuring about 1 mm by about 1 mm) having one or more laser-machined features (e.g., holes) formed therein. Debris within and around the laser-machined features of the silicon piece produces a relatively rough surface that, due to its relatively high surface area, can react more easily with the etchant solution 32 compared to a relatively smooth surface. Therefore, the debris can react with the etchant solution 32 substantially immediately after the silicon piece is immersed within the etchant bath 30 to produce an agent (e.g., a nitrite) within the etchant solution 32. In one embodiment, substrate 10 can be immersed within the etchant bath 30 at least one minute after the seed material is immersed within the etchant bath 30.

Regarding other wet-etch parameters, the temperature of the etchant solution 32 may, for example, be in a range from about 0° C. to about 150° C. and the duration of the wet-etch process may, for example, be in a range from about 30 seconds to about 1 hour. In one embodiment, the duration of the wet-etch process is about 15 minutes. Agitation of the etchant solution 32, which encompasses mixing, stirring, flowing, and the like, within the etchant bath 30 can be induced mechanically, ultrasonically, or the like or a combination thereof. The etchant solution 32 can be agitated mechanically using a magnetic stir bar, a paddle stirrer, or the like or a combination thereof. The etchant solution 32 can be agitated ultrasonically by, for example, partially submersing the etchant bath 30 within a water bath capable of being ultrasonically agitated (e.g., by an ultrasonic transducer, etc.).

Figure 4:
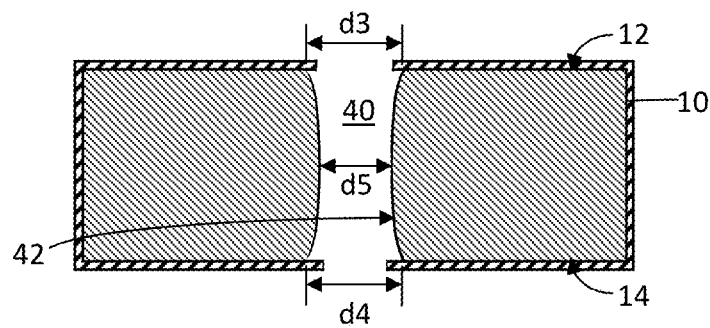
FIGS. 4 and 5 are sectional views schematically illustrating apertures formed in a substrate, according some embodiments.

Referring to FIG. 4, a wet-etch process performed without agitating the etchant solution 32 can change the cross-sectional profile of the laser-machined feature 22 to produce an aperture 40 having a cross-sectional profile resembling that of an hourglass. Accordingly, the aperture 40 has an entrance diameter d3, an exit diameter d4 that is less than or equal to the entrance diameter d3, and an internal diameter d5 that is less than the entrance and exit diameters d3 and d4. However, referring to FIG. 5, when the etchant solution 32 is sufficiently agitated, what would otherwise be the same wet-etch process can change the cross-sectional profile of the laser-machined feature 22 to produce an aperture 50 with a vertical cross-sectional profile (e.g., having vertical or at least substantially vertical sidewalls 42). Accordingly, the aperture 50 can have an entrance diameter d3, an exit diameter d4 that is substantially equal to the entrance diameter d3 and an internal diameter d5 that is substantially equal to the entrance and exit diameters d3 and d4.

In one embodiment, the etching process includes a single wet-etch process. In another embodiment however, the etching process is a multi-step wet-etch process including, for example, a first wet-etch process and a second wet-etch process performed after the first wet-etch process. Parameters of the first wet-etch process may be selected to etch sidewalls 24 of the laser-machined feature 22 faster than the second wet-etch process. In one embodiment, the composition of the etchant solution (also referred to herein as the "first etchant solution") used during the first wet-etch process may be different than the composition of the etchant solution (also referred to herein as the "second etchant solution") used during the second wet-etch process. For example, the second etchant solution may be treated as described above while the first etchant solution need not be treated. Moreover, the first etchant solution may contain a higher concentration of $HNO_3$ than the second etchant solution. In a further example, the second etchant solution may contain a higher concentration of HF than the first etchant solution. Exemplary concentrations of $HNO_3$ and HF in the first and second etchant solutions are given in the Table below. In the Table, the wt. % values given do not account for the presence of additives such as those described above.

TABLE 1

| | wt. % HNO$_3$ | wt. % HF |
|---|---|---|
| First etchant solution | about 35-about 85 | about 10-about 50 |
| Second etchant solution | about 10-about 40 | about 40-about 85 |

In one embodiment, the first etchant solution may contain 50 wt. % HNO$_3$ (~70 wt. % solution), 23 wt. % HF (~49 wt. % solution) and 27 wt. % glacial acetic acid (i.e., CH$_3$COOH, 100 wt. % solution). In another embodiment, the second solution may contain 50 wt. % HNO$_3$ (~70 wt. % solution), 25 wt. % HF (~49 wt. % solution) and 5 wt. % glacial acetic acid.

By etching the sidewalls 24 of the laser-machined feature 22 using one or more wet-etch processes as described above, one or more characteristics of the laser-machined feature 22 (e.g., the surface roughness of sidewalls 24, the entrance diameter d1, the exit diameter d2, the taper, the aspect ratio, the cross-sectional profile, etc.) can be changed to form an aperture having one or more desired characteristics. One or more wet-etch parameters can be selected to influence one or more characteristics (e.g., taper, entrance diameter, exit diameter, cross-sectional profile, aspect ratio, surface roughness, etc.) of the aperture produced by the etching process. It will be appreciated that the characteristics of the laser-machined feature 22 can also affect how the wet-etch parameters influence one or more characteristics of the aperture produced by the etching process. Thus, the parameters of the laser-drilling process can be selected to influence one or more characteristics of the aperture produced by the etching process.

Figure 6:
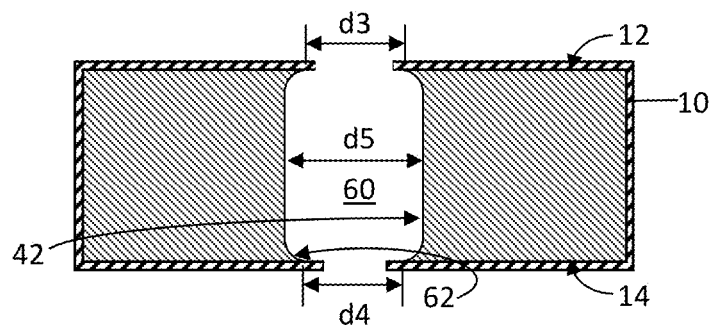
FIG. 6 is an enlarged sectional view schematically illustrating region "A" shown in the FIG. 5.

In one example, one or more wet-etch parameters can be selected to influence the entrance diameter, exit diameter and/or surface roughness of the aperture without significantly influencing the cross-sectional profile of the aperture. As a result the entrance diameter, exit diameter and surface roughness of the laser-machined feature 22 can be changed to produce an aperture having a desired entrance diameter, exit diameter and/or surface roughness, but the cross-sectional profile of the laser-machined feature 22 can be preserved in the aperture. As used herein, the cross-sectional profile of the laser-machined feature 22 is preserved in the aperture if both the laser-machined feature 22 and the aperture have the same type of cross-sectional profile. Examples of types of cross-sectional profiles include wine-glass (e.g., where a sidewall includes a convex portion adjacent to an entrance or exit), hourglass (e.g., as shown in FIG. 4), tapered, vertical (e.g., as shown in FIG. 4), and bulbous (e.g., as shown in FIG. 6). When the cross-sectional profile of the aperture is not of the same type as that of the laser-machined feature 22, the cross-sectional profile of the laser-machined feature 22 is not preserved in the aperture. It will be appreciated that one or more wet-etch parameters can be selected to ensure that the cross-sectional profile of the aperture is not of the same type as that of the laser-machined feature 22.

In another example, one or more of the aforementioned wet-etch parameters can be selected to produce an aperture having a taper that is greater than 90%. For example, the taper of the aperture can be greater than 98%. In another example, the taper of the aperture can be 100%.

In another example, one or more of the aforementioned wet-etch parameters can be selected to produce an aperture having entrance and exit diameters d3 and d4 that are larger than corresponding entrance and exit diameters d1 and d2 of the laser-machined feature 22. For example, one or both of the entrance and exit diameters d3 and d4 can be less than about 25 µm larger than corresponding entrance and exit diameters d1 and d2 of the laser-machined feature 22. In another embodiment, one or both of the entrance and exit diameters d3 and d4 can be greater than about 25 µm larger than corresponding entrance and exit diameters d1 and d2 of the laser-machined feature 22.

Figure 5:
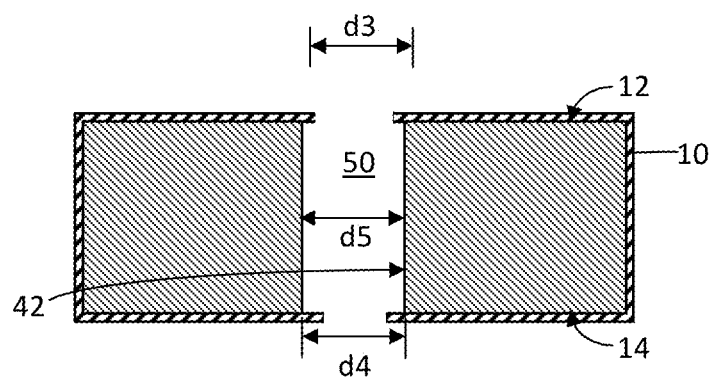

In another example, one or more of the aforementioned wet-etch parameters can be adjusted to provide an aperture having a cross-sectional profile that is different from those shown in FIGS. 4 and 5. For example, the degree to which the etchant solution 32 is agitated can be adjusted to vary cross-sectional profile between those shown in FIGS. 4 and 5. In another example, if the duration of the wet-etch process used to produce the aperture 50 shown in FIG. 5 is shortened, the wet-etch process can produce an aperture having a tapered cross-sectional profile. However, if the duration of the wet-etch process used to produce the aperture shown in FIG. 5 is lengthened, the wet-etch process can produce an aperture such as aperture 60 shown in FIG. 6. Referring to FIG. 6, sidewalls 42 of the aperture 60 include concave regions 62 adjacent to the etchmask layer 16. These concave regions 62 can be removed by performing a supplemental wet-etch process. The supplemental wet-etch process may employ an etchant solution such as the etchant solution used to produce the aperture 60, but the degree to which the etchant solution is agitated can be less compared to that used to produce the aperture 50. In another embodiment, etchant solution used in the supplemental wet-etch process can also be unagitated. The extent to which the concave regions 62 are removed can be controlled, for example, by adjusting the duration of the supplemental wet-etch process.

In another example, one or more of the aforementioned wet-etch parameters can be selected to produce an aperture having sidewalls that are smoother than sidewalls of the laser-machined feature 22. That is, the sidewalls of the aperture can have a surface roughness, Ra, of less than 10 µm. In one embodiment, over a reference length of about 60 µm, the sidewalls of the aperture can have an average surface roughness, Ra, of less than 5 µm. In another embodiment, over a reference length of about 60 µm, the sidewalls of the aperture can have an average surface roughness, Ra, of less than 3 µm. In still another embodiment, over a reference length of about 60 µm, the sidewalls of the aperture can have an average surface roughness, Ra, of less than 1 µm. In yet another embodiment, over a reference length of about 60 µm, the sidewalls of the aperture can have an average surface roughness, Ra, of less than 0.05 µm. In yet another embodiment, over a reference length of about 60 µm, the sidewalls of the aperture can have an average surface roughness, Ra, of less than 0.03 µm. In yet another embodiment, over a reference length of about 60 µm, the sidewalls of the aperture can have an average surface roughness, Ra, of about 0.026 µm and a root-mean-squared surface roughness, Rq, of about 0.031 µm. Accordingly, one or more of the aforementioned wet-etch parameters can be selected to produce an aperture having sidewalls that have at least a substantially specular, or mirror-like, surface finish.

It will be appreciated that Ra and Rq can be determined according to the following equations:

$$Ra = \frac{1}{n}\sum_{i}^{n}|\Delta Z_i| \text{ and } Rq = \sqrt{\frac{1}{n}\sum_{i}^{n}\Delta Z_i^2}$$

where n is the total number of equally-spaced measurements made along the reference length, and $\Delta Z_i$ is the vertical deviation of the surface from a mean line of the surface at an $i^{th}$ location along the reference length.

Techniques and systems for characterizing surface roughness are well known in the art. For example, a portion of the substrate can be removed (e.g., by ion beam milling or grind/polish techniques) to expose a vertical cross-section of the aperture, and the sidewalls of aperture exposed in the cross-section can then be characterized by any suitable method (e.g., by electron microscope image analysis, by atomic force microscopy, by 3D microscopy, etc.). In one embodiment, the roughness analysis can be performed using a VK-X Series 3D UV Laser Scanning Microscope with 0.5 nm Z-axis resolution, produced by KEYENCE Corporation of America, located in Elmwood Park, N.J., U.S.A. When roughness measurements taken by the VK-X Series 3D UV Laser Scanning Microscope are performed on a sidewall that is curved, a curve fit can be applied to the data obtained by the roughness measurements to numerically "flatten" the sidewall to obtain suffienctly accurate values for surface roughness parameters such as Ra and Rq discussed above.

In one embodiment, the etchmask layer 16 may be removed by any suitable method after the etching process. In another embodiment, an optional pre-clean process may be performed before the etching process to remove debris found within the laser-machined feature 22 formed during the laser-drilling process. The pre-clean process may, for example, include a dry-etch process employing an etchant such as xenon difluoride ($XeF_2$).

Figure 7:
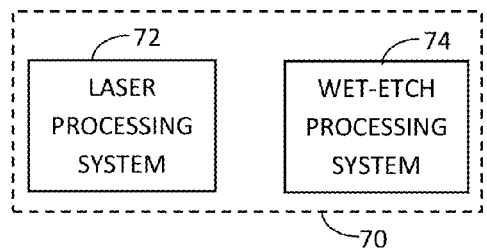
FIG. 7 is a schematic view of one embodiment of an apparatus configured to form an aperture in a substrate.

FIG. 7 is a schematic view of one embodiment of an apparatus configured to form an aperture in a substrate.

Referring to FIG. 7, an apparatus such as apparatus 70 include a laser-processing system 72, and an etch-processing system 74. Although not shown, the laser-processing system 72 can generally include a laser configured to produce a beam of laser light, optics defining an optical path, and a chuck configured to receive and secure the substrate 10. The etch-processing system may include, for example, the aforementioned etchant bath 30. The etch-processing system may include one or more other components for controlling a temperature of the etchant bath 30, monitoring a temperature of the etchant bath 30, for agitating the etchant bath 30, or the like or a combination thereof.

Figure 8A:
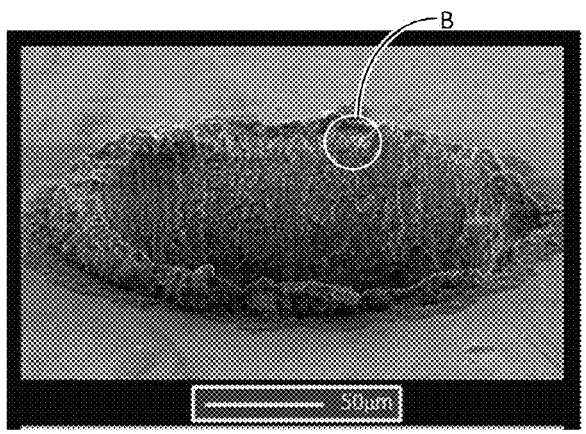
FIG. 8A is a tilted SEM image illustrating a substrate in which a laser-machined feature has been formed.
Figure 8B:
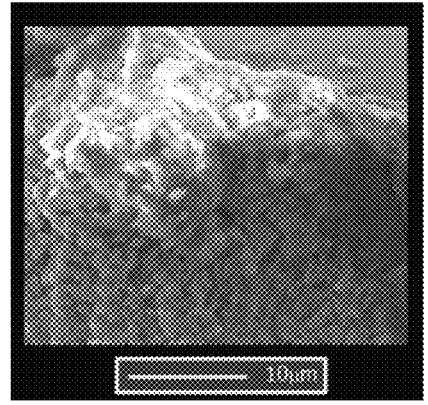
FIG. 8B is an enlarged tilted SEM image illustrating a portion of a sidewall of the laser-machined feature within region "B" shown in FIG. 8A.

FIG. 8A is a tilted SEM image illustrating a substrate in which a laser-machined feature has been formed. FIG. 8B is an enlarged tilted SEM image illustrating a portion of a sidewall of the laser-machined feature within region "B" shown in FIG. 8A.

Referring to FIGS. 8A and 8B, a laser-machined feature such as a through via was formed in a silicon substrate by laser drilling. As shown in the FIGS., sidewalls of the laser-machined feature were coated by debris generated during the laser-drilling process and were very rough.

Figure 9A:
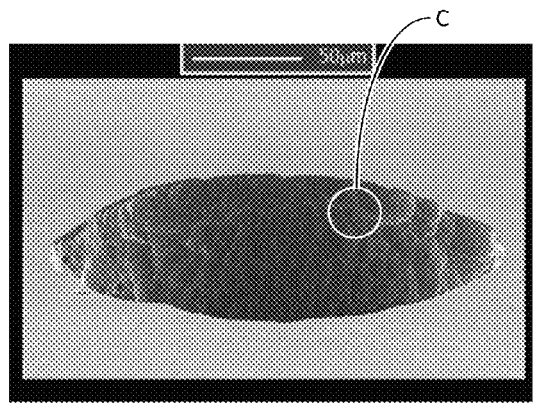
FIG. 9A is a tilted SEM image illustrating a substrate having the laser-machined feature shown in FIG. 8A, in which sidewalls of the laser-machined feature have been etched in a dry etching process.
Figure 9B:
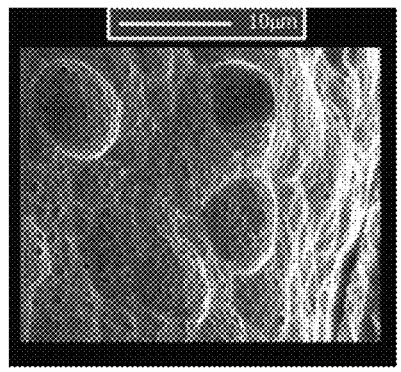
FIG. 9B is an enlarged tilted SEM image illustrating a portion of the sidewall of the laser-machined feature within region "C" shown in FIG. 9A.

FIG. 9A is a tilted SEM image illustrating a substrate having the laser-machined feature shown in FIG. 8A, in which sidewalls of the laser-machined feature have been etched in a dry etching process. FIG. 9B is an enlarged tilted SEM image illustrating a portion of the sidewall of the laser-machined feature within region "C" shown in FIG. 9A.

Referring to FIGS. 9A and 9B, the laser-machined feature shown in FIGS. 8A and 8B was dry-etched with $XeF_2$ during a pre-clean process. As shown in the FIGS., sidewalls of the laser-machined feature become smoother and debris generated during the laser-machining process can be removed. Nevertheless, the sidewalls of the laser-machined feature are relatively rough and have a golf-ball morphology. Even after a prolonged period of dry-etching with $XeF_2$, the sidewalls remained undesirably rough.

FIGS. 10, 11, 12 and 13 are tilted SEM images illustrating a portion of a dry-etched sidewall of a laser-machined feature, after the dry-etched sidewall has been etched in an etchant solution according to one embodiment for 0 seconds, 30 seconds, 5 minutes, and 15 minutes, respectively.

Figure 10:
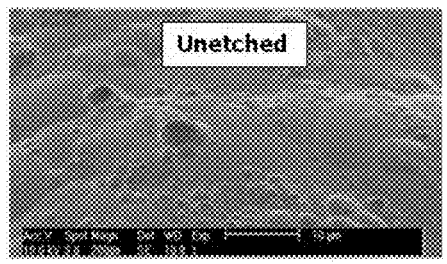
FIGS. 10, 11, 12 and 13 are tilted SEM images illustrating a portion of a dry-etched sidewall of a laser-machined feature, after the dry-etched sidewall has been etched in an etchant solution according to one embodiment for 0 seconds, 30 seconds, 5 minutes, and 15 minutes, respectively.
Figure 11:
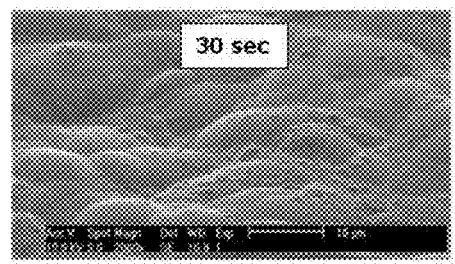
Figure 12:
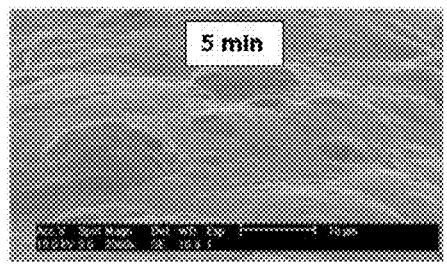
Figure 13:
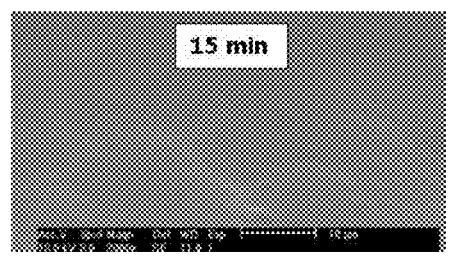

Referring to FIG. 10, the sidewall of a laser-machined feature formed in a silicon substrate that has been dry-etched with $XeF_2$ has a surface roughness of about 5 µm. Referring to FIGS. 11, 12 and 13, the sidewall laser-machined feature is wet-etched with an etchant solution containing 70% $HNO_3$ (70% stock), 25% HF (49% stock), 5% glacial acetic acid, and the surface roughness of the sidewall is reduced to produce a substantially specular surface finish. As is evident, the surface roughness of the sidewall after 15 minutes of wet-etching (as shown in FIG. 13) is significantly less than the surface roughness of the sidewall after the laser-machined feature has been dry-etched but before the laser-machined feature was wet-etched (as shown in FIG. 10). It will be appreciated that the surface roughness shown in FIG. 13 can be attained without first performing the dry-etch process, provided that one or more parameters of the wet-etch process (e.g., the duration of the wet-etch process) are adjusted accordingly.

Figure 14:
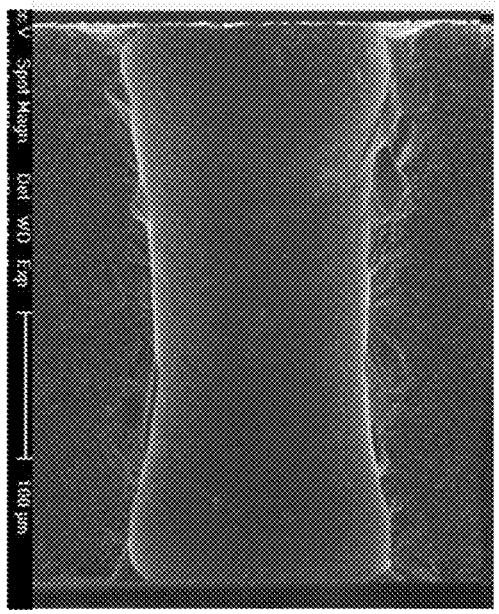
FIGS. 14 and 15 are sectional SEM images illustrating a portion a cross-sectional profile of apertures formed without and with agitation of an etchant solution, respectively.
Figure 15:
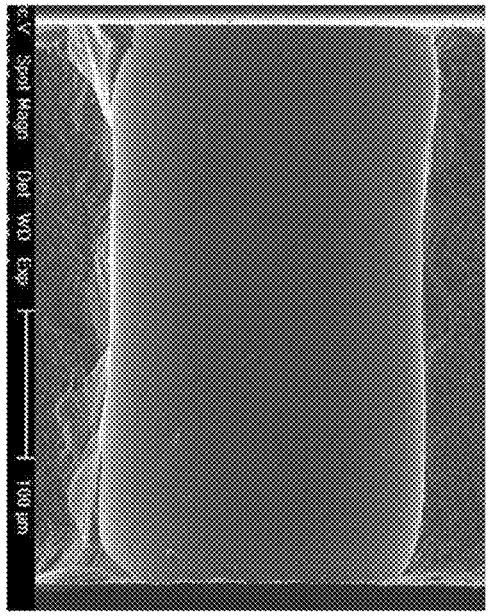

FIGS. 14 and 15 are sectional SEM images illustrating a portion a cross-sectional profile of apertures formed without and with agitation of an etchant solution, respectively.

Referring to FIG. 14, a wet-etch process was performed by subjecting a substrate containing a laser-machined feature to a first wet-etch process for 1 minute by immersing the laser-machined feature in a first etchant solution containing a mixture of 50 wt. % $HNO_3$ (70 wt. % solution), 23 wt. % HF (49 wt. % solution) and 5 wt. % glacial acetic acid. Subsequently, the substrate was subjected to a second wet-etch process for 4 minutes by immersing the laser-machined feature in a second etchant solution containing a mixture of 70 wt. % $HNO_3$ (70 wt. % solution), 25 wt. % HF (49 wt. % solution) and 5 wt. % glacial acetic acid. The mixture of the second etchant solution was treated to reduce the etch initiation period whereas the mixture of the first etchant solution was untreated. The first and second wet-etch processes were performed without agitating the first and second etchant solutions. The resultant aperture produced by the wet-etch process had a cross-sectional profile resembling that of an hourglass. Referring to FIG. 15, a substrate containing a laser-machined feature was subjected to a modified wet-etch process, similar to the wet-etch process described above with respect to FIG. 14, but the first and second etchant solutions were agitated with a magnetic stir bar. The resultant aperture produced by the modified wet-etch process had a generally vertical cross-sectional profile.

FIGS. 16, 17, 18, 19 and 20 are sectional SEM images illustrating cross-sectional profiles of laser-machined features, after the features have been etched in an etchant solution according to one embodiment for progressively longer periods of time.

Figure 16:
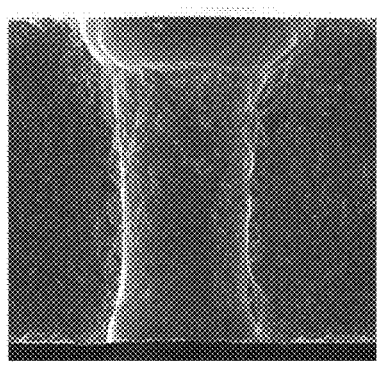
FIGS. 16, 17, 18, 19 and 20 are sectional SEM images illustrating cross-sectional profiles of laser-machined features, after the features have been etched in an etchant solution according to one embodiment for progressively longer periods of time.
Figure 17:
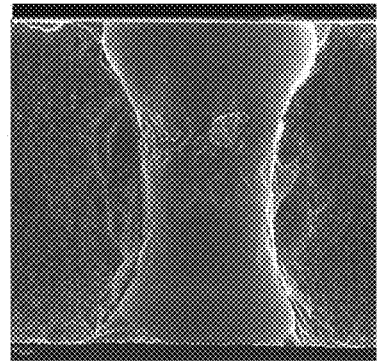
Figure 18:
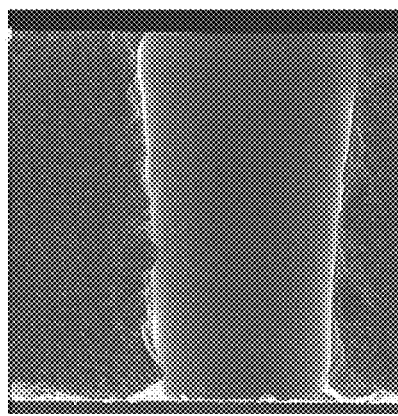
Figure 19:
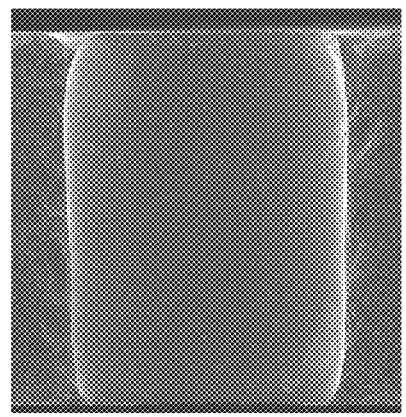
Figure 20:
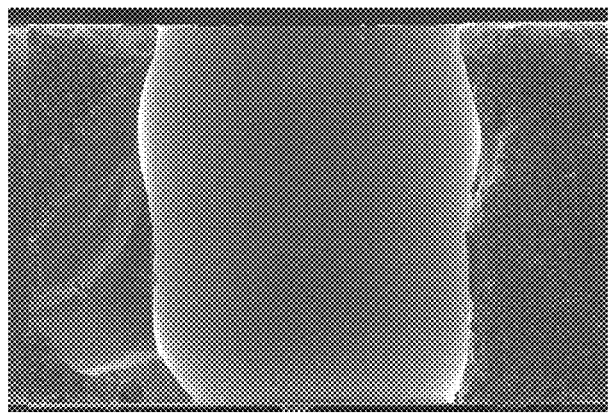

Referring to FIGS. 16, 17, 18, 19 and 20, a laser-machined feature having a diameter of 110 µm was subjected to a wet-etch process. After wet-etching for a first period of time, T1, the resulting aperture had a wine-glass profile as shown in FIG. 16. After wet-etching for a second period of time, T2, greater than T1, the resulting aperture had an hourglass profile as shown in FIG. 17. As shown in FIG. 17, the sidewalls of the aperture are generally smoother than the sidewalls of the aperture shown in FIG. 16, but some areas of the sidewalls had localized regions having relatively high surface roughness. After wet-etching for a third period of time, T3, greater than T2, the resulting aperture had a tapered profile as shown in FIG. 18. As shown in FIG. 18, the sidewalls of the aperture had at least a substantially specular finish and were substantially straight, but tapered. After wet-etching for a fourth period of time, T4, greater than T3, the resulting aperture had a substantially vertical profile as shown in FIG. 19. As shown in FIG. 19, the sidewalls of the aperture had at least a substantially specular finish and were substantially straight. However, the sidewalls of the aperture shown in FIG. 19 included concave regions near the aperture entrance and exit, thus producing a slightly bulbous cross-sectional profile. After wet-etching for a fifth period of time, T5, greater than T4, the resulting aperture had an irregular, bulbous cross-sectional profile as shown in FIG. 20. As shown in FIG. 20, the sidewalls of the aperture had at least a substantially specular finish but were not straight.

Any theory, mechanism of operation, proof, or finding stated herein is meant to further enhance understanding of the present invention and is not intended to make the present invention in any way dependent upon such theory, mechanism of operation, proof, or finding. It should be understood that while the use of the word preferable, preferably or preferred in the description above indicates that the feature so described may be more desirable, it nonetheless may not be necessary and embodiments lacking the same may be contemplated as within the scope of the invention, that scope being defined by the claims that follow. In reading the claims it is intended that words such as "a," "an," "at least one," "at least a portion" are used with no intention to limit the claim to only one item unless the claim specifically states otherwise. Further, when the language "at least a portion" and/or "a portion" is used, the item may include a portion and/or the entire item unless specifically stated otherwise. While embodiments of the present invention have been illustrated and described in detail in the drawings and foregoing description, the same is to be considered as illustrative and not restrictive in character, it being understood that only the selected embodiments have been shown and described and that all changes, modifications and equivalents that come within the spirit of the invention as defined by any of the following claims are desired to be protected.

What is claimed is:

1. A method of forming a through hole via within a substrate, the method comprising:
    providing the substrate;
    irradiating the substrate with a laser beam to form a laser-machined feature within the substrate, the laser-machined feature having a sidewall; and
    etching the sidewall with at least one etchant solution including $HNO_3$ and HF to change at least one characteristic of the laser-machined feature, wherein the etchant solution is treated to reduce an etch initiation period of the etchant solution before etching the sidewall with the etchant solution.

2. The method of claim 1, wherein the substrate is a silicon substrate.

3. The method of claim 2, wherein the etchant solution is agitated during the step of etching the sidewall.

4. The method of claim 1, wherein the substrate comprises a substrate material and has a surface covered by an etchmask layer, and wherein the laser beam removes the etchmask layer before removing substrate material to form the through hole via.

5. The method, of claim 1, wherein the at least one characteristic comprises a surface roughness of the sidewall, wherein surface roughness is equal to $1/n\Sigma_i^n |\Delta Z_i|$, wherein n is the total number of equally-spaced measurements made along a reference length of a surface of the sidewall, wherein $\Delta Z_i$ is a vertical deviation of the sidewall surface from a mean line of the sidewall surface at an ith location along the reference length, and wherein the surface roughness is less than 5 µm.

6. The method of claim 1, wherein the at least one characteristic comprises a taper of the laser-machined feature.

7. The method of claim 1, wherein the at least one characteristic comprises a cross-sectional profile of the laser-machined feature, and wherein the cross-sectional profile resembles a cross-sectional profile of an hourglass.

8. The method of claim 1, wherein etching the sidewall comprises:
    wet-etching the sidewall with a first etchant solution; and
    after etching the sidewall with the first etchant solution, wet-etching the sidewall with a second etchant solution, wherein the second etchant solution contains a lower concentration of $HNO_3$ than the first etchant solution.

9. The method of claim 8, wherein the first etchant solution contains a lower concentration of HF than the second etchant solution.

10. The method of claim 1, further comprising etching the sidewall with a dry etchant before etching the sidewall with the at least one etchant solution.

11. The method of claim 10, wherein the dry etchant comprises $XeF_2$.

12. A method of forming an aperture within a substrate, the method comprising:
    providing the substrate;
    irradiating the substrate with a laser beam to form a laser-machined feature within the substrate, the laser-machined feature having a sidewall;
    etching the sidewall to change at least one characteristic of the laser-machined feature, wherein the etching includes:
    etching the sidewall with a first etchant solution containing a first reactant at a first concentration; and
    after etching the sidewall with the first etchant solution, etching the sidewall with a second etchant solution containing the first reactant at a second concentration less than the first concentration, wherein the second etchant solution is treated to reduce an etch initiation period of the second etchant solution before etching the sidewall with the second etchant solution.

13. The method of claim 12, wherein the first reactant is $HNO_3$.

14. The method of claim 13, wherein the first etchant solution and the second etchant solution further comprise HF.

15. The method of claim 12, wherein treating the second etchant solution comprises immersing a seed material within the second etchant solution, the seed material comprising the same material as the substrate.

16. The method of claim 15, wherein the seed material comprises a silicon piece having at least one laser-machined feature formed therein.

17. The method of claim 8, wherein irradiation of the substrate forms a heat-affected zone adjacent to the laser-machined feature, wherein the laser-machined feature is an aperture having an initial cross-sectional profile, wherein the initial cross-sectional profile of the laser-machined feature is changed by emersion of the heat-affected zone in the etchant solution and by oxidizing a portion of the heat-affected zone while the substrate immersed in the etchant solution to remove a portion of the oxidized heat-affected zone, thereby causing the aperture to have an etched cross-sectional profile that is larger than the initial cross-sectional profile.

18. The method of claim 17, wherein the initial cross-sectional profile is tapered as a function of depth and wherein the etched cross-sectional profile is vertical.

19. The method of claim 12, wherein the substrate has a first surface and a second surface opposite the first surface, wherein the laser-machined feature comprises an aperture extending from the first surface into the substrate toward the second surface,
 wherein the aperture comprises a sidewall, and
 wherein an average surface roughness is equal to $1/n\Sigma_i^n |\Delta Z_i|$, wherein n is the total number of equally-spaced measurements made along a reference length of a surface of the sidewall, wherein $\Delta Z_i$ is a vertical deviation of the sidewall surface from a mean line of the sidewall surface at an ith location along the reference length, and wherein the average surface roughness of a portion, of the sidewall is less than 10 μm.

20. The method of claim 19, wherein the average surface roughness is less than 1 μm.

21. The method of claim 20, wherein the average surface roughness is less than 0.03 μm.

22. The method of claim 19, wherein the aperture is a through via extending from the first surface to the second surface.

23. The method of claim 22, wherein the through via has a taper of greater than 90%.

24. The method of claim 23, wherein the through via has a taper of 100%.

25. The method of claim 19, wherein the substrate is an interposer substrate.

26. The method of claim 1, wherein the substrate comprises first and second surfaces, and wherein the substrate is irradiated from both the first and second surfaces to form the through hole via.

27. The method of claim 1, wherein treating the etchant solution comprises adding sodium nitrite to the etching solution.

28. The method of claim 1, wherein treating the etchant solution comprises immersing a seed material within the etchant solution, the seed material comprising the same material as the substrate.

29. The method of claim 28, wherein the seed material is roughened prior to immersion.

30. The method of claim 1, wherein the laser machined feature is a blind via, and wherein etching with at least one etching solution completes formation of the through hole via.

31. The method of claim 1, wherein the etchant solution is a first etchant solution, the method further comprising:
 etching the sidewall with a second etchant solution after etching the sidewall with the first etchant solution, wherein the first etchant solution is selected to etch the sidewall faster than the second etchant solution.

32. The method of claim 28, wherein the seed material comprises a silicon piece having at least one laser-machined feature formed therein.

33. The method of claim 15, wherein the seed material is roughened prior to immersion.

* * * * *